(12) United States Patent
Hsieh et al.

(10) Patent No.: US 6,720,246 B1
(45) Date of Patent: Apr. 13, 2004

(54) FLIP CHIP ASSEMBLY PROCESS FOR FORMING AN UNDERFILL ENCAPSULANT

(75) Inventors: Han-Kun Hsieh, Miaoli (TW); Wei-Feng Lin, Hsinchu (TW)

(73) Assignee: Silicon Integrated Systems Corp., Hsin chu (TW)

( * ) Notice: Subject to any disclaimer, the term of this patent is extended or adjusted under 35 U.S.C. 154(b) by 0 days.

(21) Appl. No.: 10/348,957

(22) Filed: Jan. 23, 2003

(51) Int. Cl.$^7$ ............................................... H01L 21/44
(52) U.S. Cl. ........................ 438/615; 438/108; 438/458; 438/612
(58) Field of Search ................................ 438/612, 613, 438/614, 615, 119, 118, 108

(56) References Cited

U.S. PATENT DOCUMENTS

| | | | | |
|---|---|---|---|---|
| 5,286,679 A | * | 2/1994 | Farnworth et al. | 438/118 |
| 5,341,564 A | * | 8/1994 | Akhavain et al. | 29/832 |
| 5,897,336 A | * | 4/1999 | Brouillette et al. | 438/108 |
| 6,410,415 B1 | * | 6/2002 | Estes et al. | 438/612 |
| 6,489,681 B2 | * | 12/2002 | Jiang et al. | 257/737 |
| 6,518,677 B1 | * | 2/2003 | Capote et al. | 257/783 |
| 6,566,234 B1 | * | 5/2003 | Capote et al. | 438/458 |
| 6,583,039 B2 | * | 6/2003 | Chen et al. | 438/612 |

* cited by examiner

Primary Examiner—Michael Trinh
Assistant Examiner—Khanh Duong
(74) Attorney, Agent, or Firm—Birch, Stewart, Kolasch & Birch, LLP

(57) ABSTRACT

A flip chip assembly process forming an underfill encapsulant. The method includes providing a chip having an active surface and a plurality of conductive bumps arranged in array with a predetermined bump pitch thereon, providing a substrate having a surface, having a die-attaching region, having a plurality of pads with previously formed solder paste thereon, arranged in array with a predetermined pad pitch the same as the active surface, forming an encapsulant in the die-attaching region excluding the pads, using a stencil and screen printing, and attaching the chip onto the substrate resulted from one-to-one joining the conductive bumps and the pads. A tool forming an underfill encapsulant is includes a stencil having at least one printing region, including a plurality of openings, a plurality of covers arranged in array with a predetermined cover pitch, and a plurality of connecting devices, connecting every two neighboring covers, or each cover with other regions of the stencil.

9 Claims, 5 Drawing Sheets

FLIP CHIP ASSEMBLY PROCESS FOR FORMING AN UNDERFILL ENCAPSULANT

BACKGROUND OF THE INVENTION

1. Field of the Invention

The present invention relates to a flip chip assembly process and a tool therefor, and more specifically to a process and a tool to form an encapsulant on a substrate by screen printing.

2. Description of the Related Art

Due to the demand for high-density and high-power electronic packaging, flip chip technology has become important in many fields. Flip chip technology is characterized by flipping over the bare die for attachment to a substrate. When an organic material is used as the substrate, the great difference between the coefficient of thermal expansion between the organic substrate (14–17 ppm/° C.) and the silicon wafer (4 ppm/° C.) causes significant strain on the solder connections during temperature cycling, which results in easy deterioration of the connections.

Therefore, to enhance reliability, encapsulant is usually filled into the space between the substrate and the chip. In this way, the stress can be dispersed to the encapsulant to decrease the stress on the connections. Thus, connection cracking can be alleviated, the crack will not extend, and the life of the connections is prolonged. In addition, the encapsulant can also prevent the transmission of leak current caused by impurities between the solder connections. Statistical data shows that the reliability of the chip can be increased five to ten times once underfill encapsulation is conducted. Therefore, underfill encapsulation is a necessary process. However, it suffers from the long time required for underfilling and curing of the encapsulant.

Currently, most flip chip packages are encapsulated by dispensing a liquid encapsulant with low viscosity along the periphery of the chip. Capillary action, generated from the encapsulant in the fine space (less than 100 $\mu$m) between the chip and the substrate, drives the encapsulant to fill the gap between the solder connections. Since filling is conducted by capillary action, it is very slow. This problem becomes even more serious as the chip size increases because filling time is proportional to the square of the length of the chip. For example, in a typical encapsulation operation, the filling takes several minutes to several tens of minutes for a 7 mm square chip depending on the filling temperature. As well, since capillary action is insufficient and the pressure cannot be effectively maintained, voids are easily formed in the encapsulant when the filling is complete. Moreover, the voids cause the flip chip package to be scrapped from either popcorn effect, caused during the following thermal processes, or stress concentration, caused when the flip chip package is stressed. Thus, reliability is adversely affected. Also, one set of underfill tools can only encapsulate a single flip chip package at a time, so the only way to increase underfill throughput is to purchase more underfill tools, increasing production costs. Finally, it is necessary to divide the substrate into single packages before filling the encapsulant, causing low throughput in subsequent process such as ball placement.

SUMMARY OF THE INVENTION

Thus, the main object of the present invention is to provide a flip chip assembly process and a tool therefor allowing underfill to be finished in a shorter period to increase the underfill throughput of flip chip assembly.

Another object of the present invention is to provide a flip chip assembly process and a tool therefor that prevents voids in the encapsulant, improving the production yield of flip chip assembly and to produce a flip chip package with higher reliability and longer life.

Another object of the present invention is to provide a flip chip assembly process and a tool therefor allowing a plurality of divided substrates respectively having one single package unit to be encapsulated at the same time to further increase the underfill throughput of flip chip assembly.

Another object of the present invention is to provide a flip chip assembly process and a tool therefor allowing one substrate having a plurality of package units, or a plurality of substrates respectively having a plurality of package units to be encapsulated at the same time to further increase the underfill throughput of flip chip assembly.

In order to achieve the above objects, the present invention provides a flip chip assembly process forming an underfill encapsulant. First, a chip comprising an active surface, having a plurality of conductive bumps arranged in array with a predetermined pitch, is provided. Then, a substrate comprising a surface, having a die-attaching region, having a plurality of pads with previously formed solder paste on each, arranged in array having a predetermined pitch, is provided. Further, an encapsulant is formed in the die-attaching region excluding the pads, using a stencil and screen printing. Finally, the chip is attached to the substrate by one-to-one joining of the conductive bumps and the pads.

The present invention further provides a tool forming an underfill encapsulant, comprising a printing region and other regions. The printing region further comprises a plurality of openings, a plurality of covers, and a plurality of connecting devices connecting one cover with the neighboring stencil region.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting their scope, since numerous modifications and variations will be apparent to those skilled in this art.

First Embodiment

FIG. 1A through FIG. 1E show the manufacturing steps of a flip chip assembly process forming an underfill encapsulant in accordance with the first embodiment of the present invention. The present invention is able to quickly finish the flip chip assembly process forming an underfill encapsulant to increase the throughput, and further prevent voids in the underfill encapsulant, improving production yield of the flip chip assembly process and producing a flip chip package with higher reliability and longer life.

Figure 1A:
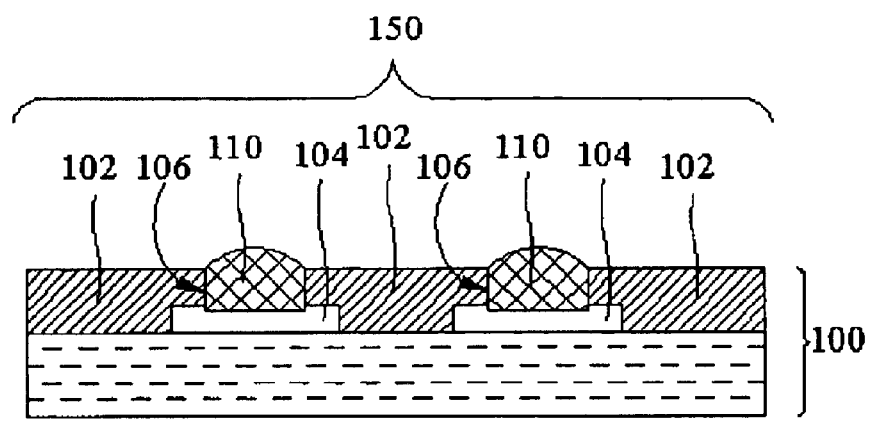
FIGS. 1A through 1E are cross-sections illustrating the manufacturing steps of a flip chip assembly process forming an underfill encapsulant in accordance with the first embodiment of the present invention.
Figure 1B:
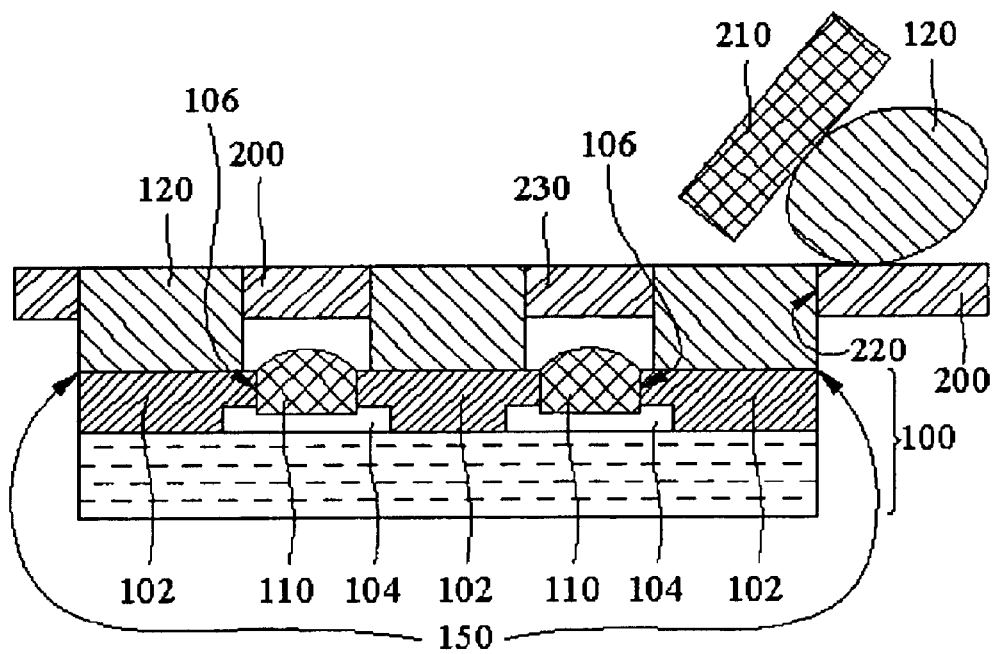
Figure 1C:
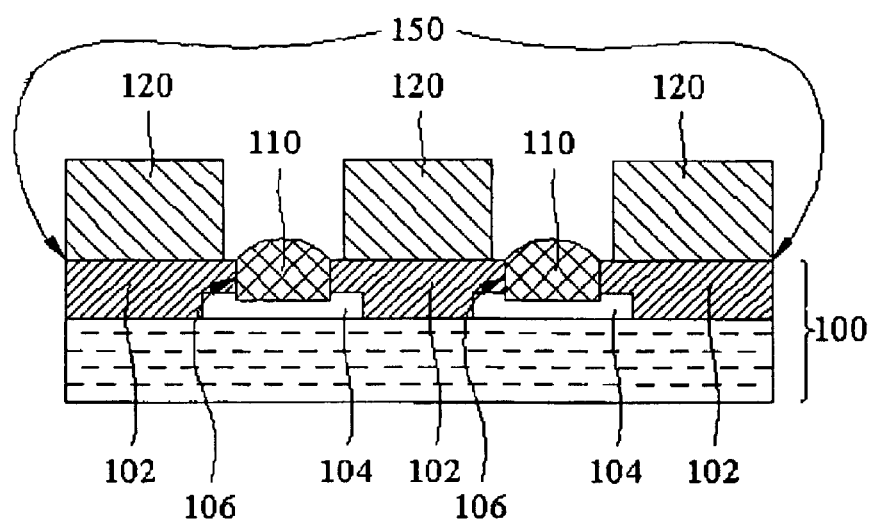
Figure 1D:
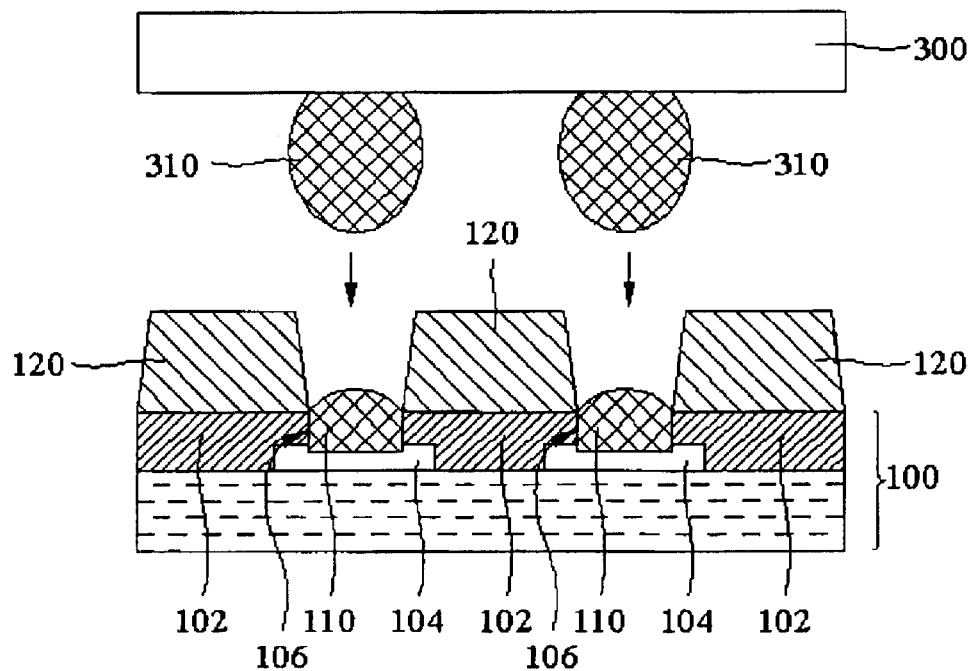

In FIG. 1A, a substrate 100 comprising a surface, having a die-attaching region 150, having a plurality of pads 104 with a previously formed solder paste 110 on each, arranged in array having a predetermined pitch designed as bumps 310 shown in FIG. 1D of chip 300 predetermined to be attached on substrate 100, is provided. Substrate 100 further comprises a solder mask 102 in the surface to protect wiring (not shown) of substrate 100 from shorting caused by contamination by solder in subsequent soldering steps. Solder mask 102 comprises a plurality of openings 106 arranged in the same way as those of the pads 104, exposing the openings 106 respectively. Pads 104 are electrically connected with the wiring of substrate 100, connecting chip 300 shown in FIG. 1D and substrate 100 to each other after attaching chip 300 to substrate 100 by one-to-one joining of bumps 310 and pads 104. The pitch between two neighboring pads 104 is approximately 180 μm or above, the same as that between two neighboring bumps 310 shown in FIG. 1D. A solder paste 110, a mixture of metal powders and a flux, is previously formed on each pad 104, in each opening 104, to assist one-to-one joining of bumps 310 and pads 104 in the following steps.

In FIG. 1B, aligning substrate 100 with a stencil 200 or aligning a stencil 200 with substrate 100 to align each solder paste 110, respectively on a pad 104, each with cover 230 respectively. Thus, an underfill encapsulant 120 is formed in die-attaching region 150 excluding openings 106 by putting the underfill encapsulant 120 on a stencil and smoothing underfill encapsulant 120 with a wiper 210 in a direction to print the underfill encapsulant 120 onto substrate 200.

FIG. 1C shows finished formation of underfill encapsulant 120 in die-attaching region 150 excluding openings 106. In FIG. 1D, each bump 310 of chip 300 is aligned with each pad 104 on substrate 100 respectively. Composition of bump 310 is Au, Cu, Cu based alloy, tin-lead alloy, or tin containing alloy.

Figure 1E:
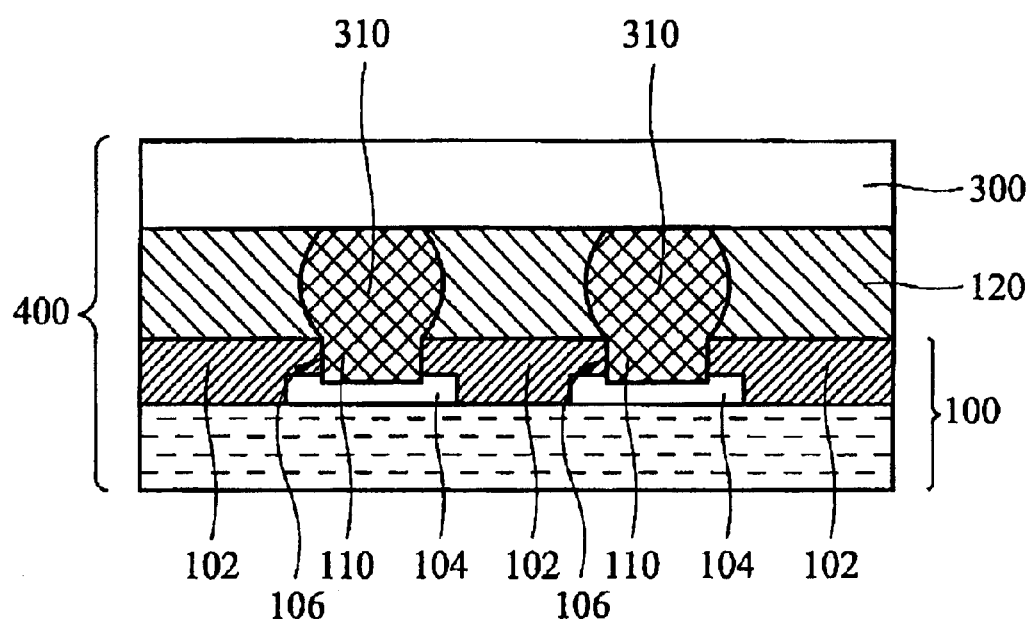

In FIG. 1E, to attach the aligned chip 300 to substrate 100, a package 400 is provided. The next step comprises either heating package 400 to a temperature between the melting point of metal powders of solder paste 110 and the melting point of bump 310, to cure underfill encapsulate 120 (curing), and then heating package 400 to another temperature higher than the melting point of metal powders of solder paste 110 and that of bump 310 to join each bump 310 to each pad 104 respectively, using a method such as reflow. Alternatively, package 400 can be heated to a temperature exceeding the melting point of metal powders of solder paste 110 and that of bump 310 to join each bump 310 to each pad 104 respectively and cure underfill encapsulate 120 at the same time.

Second Embodiment

Figure 2A:
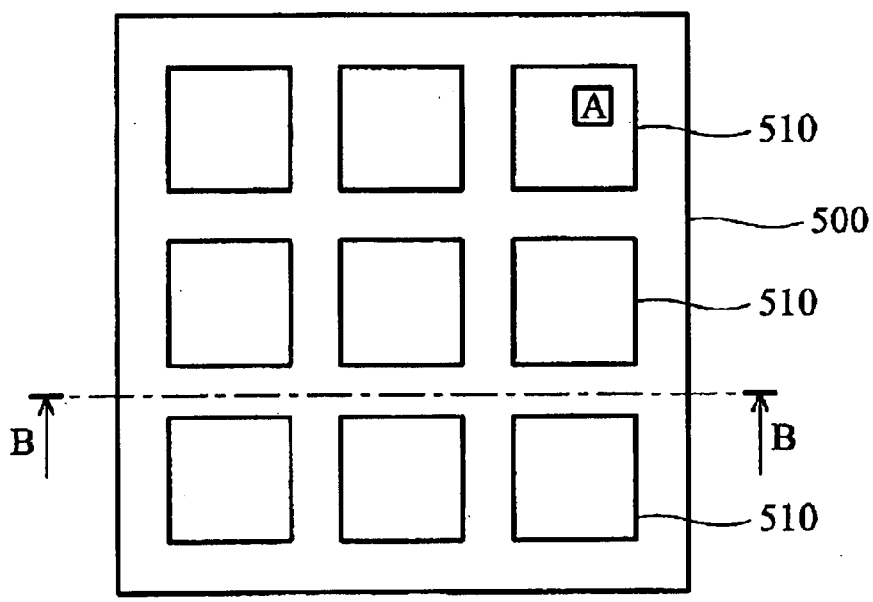
FIG. 2A through FIG. 2C are top views and a cross-section illustrating the outline and composition of a tool forming an underfill encapsulant in accordance with the second embodiment of the present invention.
Figure 2B:
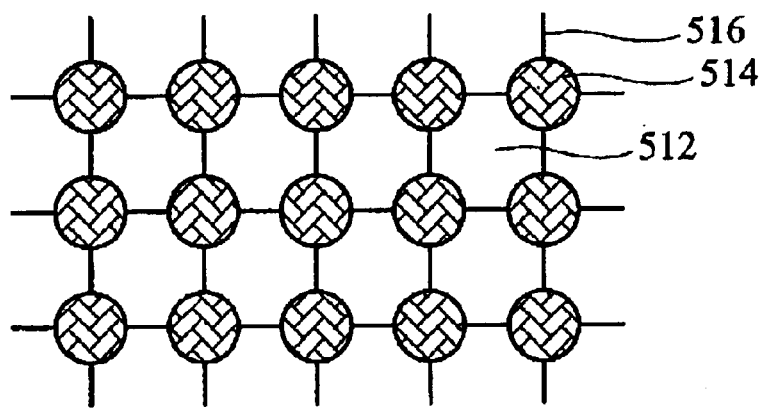
Figure 2C:
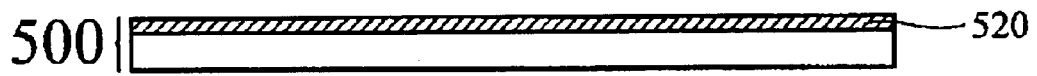

FIGS. 2A through 2C show the outline and composition of a tool forming an underfill encapsulant in accordance with the second embodiment of the present invention. The present invention quickly finishes the flip chip assembly process forming an underfill encapsulant, increasing the throughput, and further prevents voids in the underfill encapsulant, improving the production yield of the flip chip assembly process and producing a flip chip package with higher reliability and longer life.

The present invention encapsulates a plurality of divided substrates respectively, having one single package unit, determined by the design of the stencil in accordance with the second embodiment of the present invention to further increase the underfill throughput of flip chip assembly. The present invention can encapsulate one substrate having a plurality of package units, or a plurality of substrates respectively having a plurality of package units, to not only further increase the underfill throughput of flip chip assembly, but to increase the throughput of the following process such as ball placement, to further increase the throughput of the entire flip chip assembly process.

In FIG. 2A, a stencil 500, having nine printing regions 510, encapsulates nine divided substrates respectively having one single package unit, and is able to encapsulate one or more undivided substrates having a total of nine package units at the same time according to the request in the flip chip assembly process forming an is underfill encapsulant.

Note that design of the stencil in accordance with the present invention can accommodate substrates of different designations, package units of different dimensions, capabilities of a printing apparatus (not shown), or other conditions to encapsulate a plurality of divided substrates respectively having one single package unit, one substrate having a plurality of package units, or a plurality of substrates respectively having a plurality of package units, and is not limited by the stencil 500 in accordance with the second embodiment of the present invention.

In FIG. 2B, a close-up of sub-region A in printing region 510 is shown. Printing region 510 comprises a plurality of openings 512, a plurality of covers 514, and a plurality of connecting devices 516. opening 512 allows an encapsulant (not shown) to pass when smoothing, to spread the encapsulant on a substrate (not shown) Cover 514 covers the regions of the substrate which cannot receive the encapsulant, such as a pad (not shown) or other regions, to prevent the encapsulant from collecting thereon. Connecting device 516 connects two neighboring covers 514, or a cover 514 with other regions of stencil 500.

Note that the arrangements and dimensions of opening 512, cover 514, and connecting device 516 are designed for the substrate to receive an encapsulant, and can be further varied for different designations of the substrate, to not be limited by what is shown in FIG. 2B.

Stencil 500 can be metal or a composite material consisting of a metal covered by an organic material. In FIG. 2C, a cross-section along the BB line in FIG. 2A is shown. It is preferred to form a coating layer 520 on one or two surfaces of stencil 500 to protect the surface of stencil 500 from sticking by foreign material such as the encapsulant or other materials, being corroded, or being scratched, negatively affecting the life of stencil 500 or to the manufacturing steps of a flip chip assembly process forming an underfill encapsulant in accordance with the present invention.

Although the present invention has been particularly shown and described above with reference to two specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A flip chip assembly process for forming an underfill encapsulant, comprising:

providing a chip having an active surface and a plurality of conductive bumps arranged in array with a predetermined bump pitch;

providing a substrate having a surface, having a die-attaching region, having a plurality of pads with previously formed solder paste respectively thereon, arranged in array with the same predetermined pad pitch as the active surface;

forming an encapsulant in the die-attaching region excluding the pads, using a stencil and screen printing, the stencil having a plurality of openings, allowing the encapsulant to pass when forming the encapsulant, to deposit the encapsulant onto the substrate, a plurality of covers arranged in array with a predetermined cover pitch the same as the predetermined bump pitch, covering the pads when forming the encapsulant, and a plurality of connecting devices, connecting every two neighboring covers, or every cover with other regions of the stencil; and attaching the chip to the substrate, thereby one-to-one joining the conductive bumps and the pads.

2. The flip chip assembly process as claimed in claim 1, wherein the stencil is metal.

3. The flip chip assembly process as claimed in claim 1, wherein the stencil is composite material comprising a metal covered by an organic material.

4. The flip chip assembly process as claimed in claim 1, further comprising a heating step to cure the encapsulant.

5. The flip chip assembly process as claimed in claim 1, further comprising a heating step to join the conductive bumps and pads respectively.

6. The flip chip assembly process as claimed in claim 1, further comprising a heating step to join the conductive bumps and pads respectively and cure the encapsulant.

7. The flip chip assembly process as claimed in claim 1, wherein the predetermined bump pitch is approximately 180 $\mu$m above.

8. The flip chip assembly process as claimed in claim 1, wherein the predetermined pad pitch is approximately 180 $\mu$m or above.

9. The flip chip assembly process as claimed in claim 1, wherein the predetermined cover pitch is approximately 180 $\mu$m or above.

* * * * *